(12) United States Patent
Huang et al.

(10) Patent No.: US 12,237,350 B2
(45) Date of Patent: Feb. 25, 2025

(54) NMOS STRUCTURE AND MANUFACTURING METHOD THEREOF

(71) Applicant: UNITED MICROELECTRONICS CORPORATION, Hsinchu (TW)

(72) Inventors: Hau-Yuan Huang, Zhubei (TW); Chia-Chen Tsai, Tainan (TW); Jia-Bin Yeh, Tainan (TW); Shou-Wei Hsieh, Hsinchu (TW)

(73) Assignee: UNITED MICROELECTRONICS CORPORATION, Hsinchu (TW)

( * ) Notice: Subject to any disclaimer, the term of this patent is extended or adjusted under 35 U.S.C. 154(b) by 505 days.

(21) Appl. No.: 17/539,222

(22) Filed: Dec. 1, 2021

(65) Prior Publication Data
US 2023/0145660 A1 May 11, 2023

(30) Foreign Application Priority Data
Nov. 8, 2021 (CN) .......................... 202111313557.7

(51) Int. Cl.
*H01L 27/146* (2006.01)
(52) U.S. Cl.
CPC .. *H01L 27/14612* (2013.01); *H01L 27/14689* (2013.01)

(58) Field of Classification Search
CPC ........ H04N 5/361; H04N 5/369; H04N 5/374; H01L 27/14612–14893
See application file for complete search history.

(56) References Cited

U.S. PATENT DOCUMENTS

| 2013/0056825 | A1 | 3/2013 | Chen et al. | |
| 2015/0325610 | A1* | 11/2015 | Watanabe | H01L 27/14689 257/292 |
| 2018/0366502 | A1* | 12/2018 | Tatani | H01L 27/14609 |

* cited by examiner

*Primary Examiner* — Moazzam Hossain

(57) ABSTRACT

An NMOS structure includes a semiconductor substrate, a dielectric structure, a source doped region, a drain doped region, a channel region, a gate structure and two isolation P-type wells. The dielectric structure is formed in the semiconductor substrate to define an active region, in which the source/drain doped region and the channel region are formed. The channel region includes two opposite first sides and two opposite second sides. The source/drain doped region is respectively formed between the two second sides and the dielectric structure. The gate structure is formed on the semiconductor substrate. The gate structure covers a part of the dielectric structure beside the first sides. The two isolation P-type wells are formed in a part of the dielectric structure not covered by the gate structure. The isolation P-type wells respectively surround a periphery of the source/drain doped region and end at the respective second side.

6 Claims, 5 Drawing Sheets

NMOS STRUCTURE AND MANUFACTURING METHOD THEREOF

FIELD OF THE INVENTION

The present invention relates to a semiconductor technology, and more particularly to an N-channel metal oxide semiconductor (NMOS) structure applicable to an image signal processing (ISP) unit of a CMOS image sensor (CIS) and a manufacturing method of the NMOS structure.

BACKGROUND OF THE INVENTION

Semiconductor image sensing devices are widely used in various applications (digital cameras, camcorders, printers, scanners, etc.) to capture images. The semiconductor image sensing device includes an image sensor for capturing optical information and converting the optical information into electronic signals. This electronic signal is processed, stored, and used to generate images on a display or media (such as printed media). The widely used CMOS image sensor can operate with low power consumption, so it is suitable for portable electronic devices. The CMOS image sensor generally includes a CMOS image sensor unit and an image signal processing unit. The function of the CMOS image sensor unit is to convert the optical information into electronic information, and the function of the image signal processing unit is to process the electronic information. Specifically, the CMOS image sensor unit includes a pixel array, which is composed of photocells and related digital encoding circuits. Each photocell includes a photodiode to sense the amount of light emitted and convert the light information into an analog voltage level. The digital coding circuit converts the voltage level to the corresponding digital code by corrected double sampling (CDS). The digital code is provided to the image signal processing unit, and the image signal processing unit performs a signal processing function on the received digital code.

Generally, the image signal processing unit includes a low-noise amplifier, and the transistor in the low-noise amplifier mainly uses NMOS. The transconductance improvement of NMOS is beneficial to having a better low-noise amplifier performance in the image signal processing unit. In the NMOS structure, the most effective and simple way to improve the transconductance improvement is through reducing the dopant dose to reduce the carrier scattering in the channel region. However, the P-type well with low doping dose is likely to cause the leakage current between the source/drain to the deep N-wells and actually suppresses the transconductance improvement.

SUMMARY OF THE INVENTION

The present invention provides an NMOS structure and a manufacturing method of the NMOS structure, wherein the NMOS structure can have a better low-noise amplifier performance in an image signal processing unit.

The NMOS structure provided by the present invention is applicable to an image signal processing unit of an image sensor. The NMOS structure includes a semiconductor substrate, a dielectric structure, a source doped region, a drain doped region, a channel region, a gate structure and two isolation P-type wells. The semiconductor substrate has a deep N-type well and a P-type well. The dielectric structure is formed in the semiconductor substrate to define an active region in the semiconductor substrate, wherein the dielectric structure surrounds the active region. The source doped region, the drain doped region and the channel region are formed in the active region. The source doped region and the drain doped region are separated by the channel region. The channel region includes two opposite first sides and two opposite second sides. The two first sides extend to the dielectric structure. The source doped region and the drain doped region are respectively formed between the two second sides and the dielectric structure. The gate structure is formed on the semiconductor substrate and corresponding to the channel region. The gate structure covers a part of the dielectric structure beside the two first sides of the channel region. The two isolation P-type wells are formed in a part of the dielectric structure not covered by the gate structure. One of the two isolation P-type wells surrounds a periphery of the source doped region and ends at one of the two second sides of the channel region, and the other of the two isolation P-type wells surrounds a periphery of the drain doped region and ends at the other of the two second sides of the channel region.

In an embodiment of the present invention, the aforementioned NMOS structure is applicable to a low-noise amplifier of the image signal processing unit.

In an embodiment of the present invention, the dielectric structure is a shallow trench isolation structure, a field oxide structure, or a combination thereof.

In an embodiment of the present invention, a depth of the two isolation P-type wells is greater than a depth of the dielectric structure.

In an embodiment of the present invention, the dielectric structure has a frame shape and includes two spaced and opposite first isolation portions and two spaced and opposite second isolation portions. The two first isolation portions define the two first sides of the channel region. The gate structure further covers a part of the two first isolation portions.

In an embodiment of the present invention, the two isolation P-type wells are formed in a part of the two first isolation portions not covered by the gate structure and the two second isolation portions.

In an embodiment of the present invention, the two isolation P-type wells and the periphery of the source doped region and the periphery of the drain doped region are respectively separated by a part of the dielectric structure.

The manufacturing method of an NMOS structure provided by the present invention includes steps of: providing a semiconductor substrate, wherein the semiconductor substrate has a deep N-type well and a dielectric structure, the dielectric structure defines an active region in the semiconductor substrate, and the dielectric structure surrounds the active region; providing a first mask to define a source pattern region, a drain pattern region and a channel region in the active region, wherein the channel region is located between the source pattern region and the drain pattern region, the channel region includes two opposite first sides and two opposite second sides, and the two first sides extend to the dielectric structure; providing a second mask, wherein the second mask defines at least one gate shielding pattern and two isolation pattern openings in advance, the gate shielding pattern covers the channel region and a part of the dielectric structure beside the two first sides of the channel region, and the two isolation pattern openings are separated by the gate shielding pattern; performing a first doping process to form a P-type well in the active region; performing a second doping process on the dielectric structure through the two isolation pattern openings of the second mask to form two isolation P-type wells in the dielectric structure, wherein the two isolation P-type wells respectively surround the source pattern region and the drain pattern region and end at the gate shielding pattern; forming a gate structure on the semiconductor substrate, wherein the gate structure covers the channel region and a part of the dielectric structure beside the two first sides of the channel region; and performing a third doping process on the source pattern region and the drain pattern region to form a source doped region and a drain doped region in the source pattern region and the drain pattern region, respectively.

In the present invention, because the isolation P-type well is not formed on the two first sides of the channel region, the concentration of the isolation P-type well does not diffuse into the channel region from the first side, so that the channel region can reduce the carrier scattering by reducing the amount of doping to improve transconductance, which is beneficial to having a better low-noise amplifier performance in the image signal processing unit. In addition, the two isolation P-type wells are respectively disposed to surround the source doped region and the drain doped region. Because the depth of the isolation P-type well is greater than the depth of the dielectric structure, the concentration of the isolation P-type well will diffuse into the P-type well below the source doped region and the drain doped region, so that it has the effect of suppressing leakage current between the source doped region/drain doped region and the deep N-type well.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
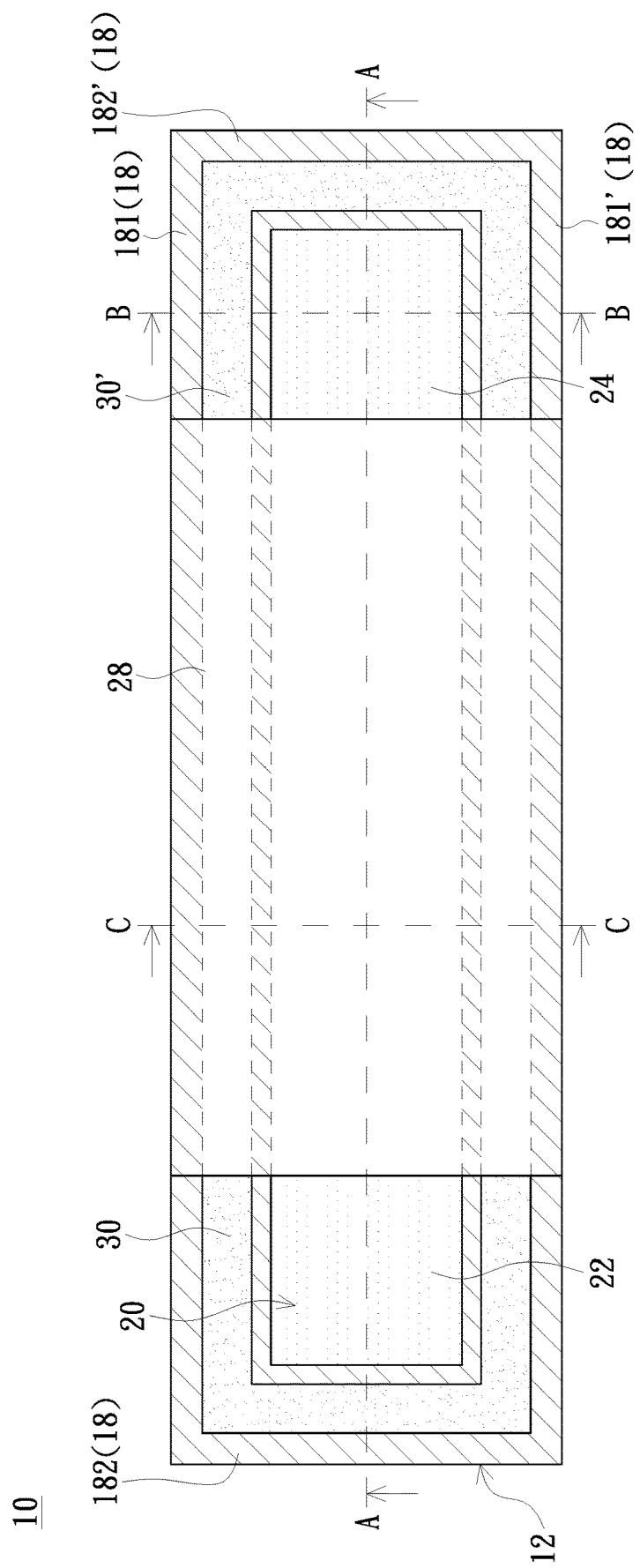
FIG. 1 is a schematic top view of an NMOS structure according to an embodiment of the present invention.
Figure 2:
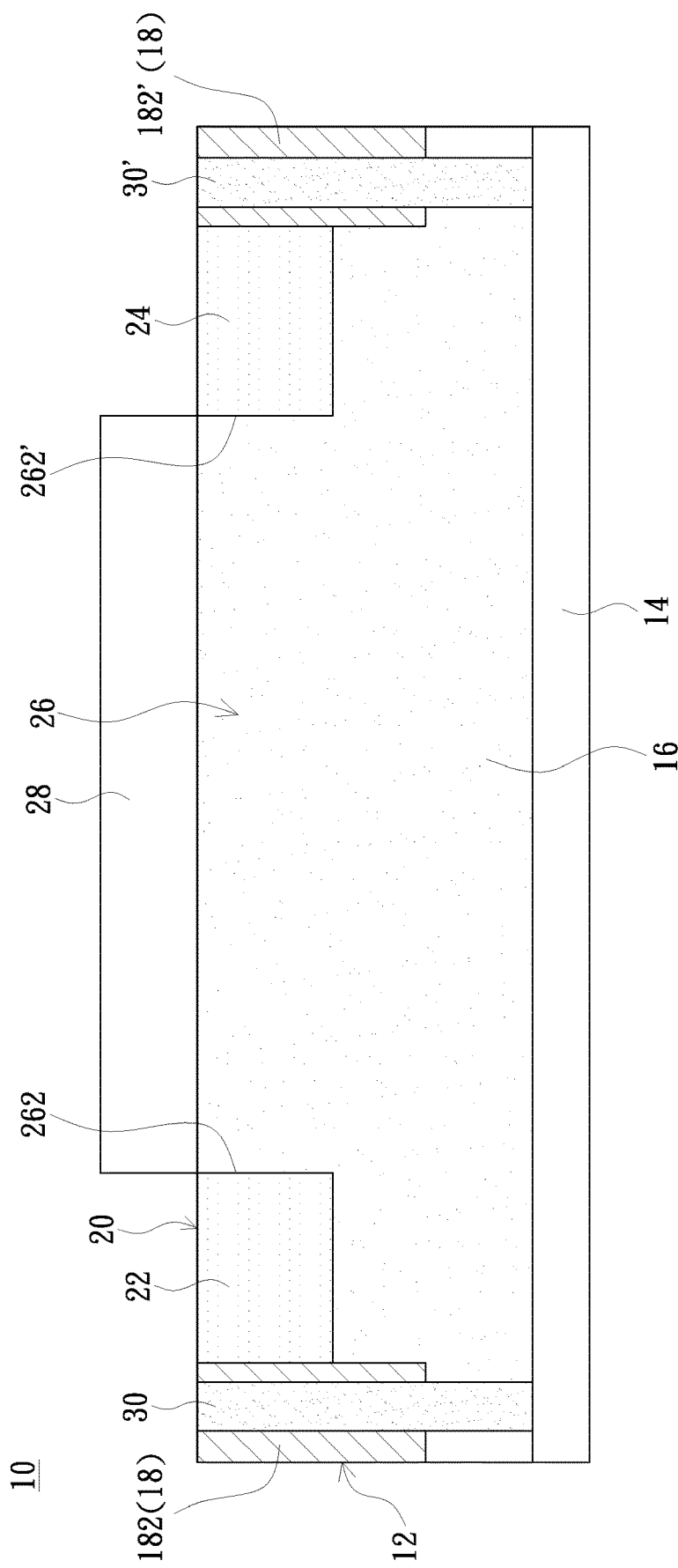
FIG. 2 is a schematic cross-sectional view of the NMOS structure, taken along the line A-A in FIG. 1.
Figure 3:
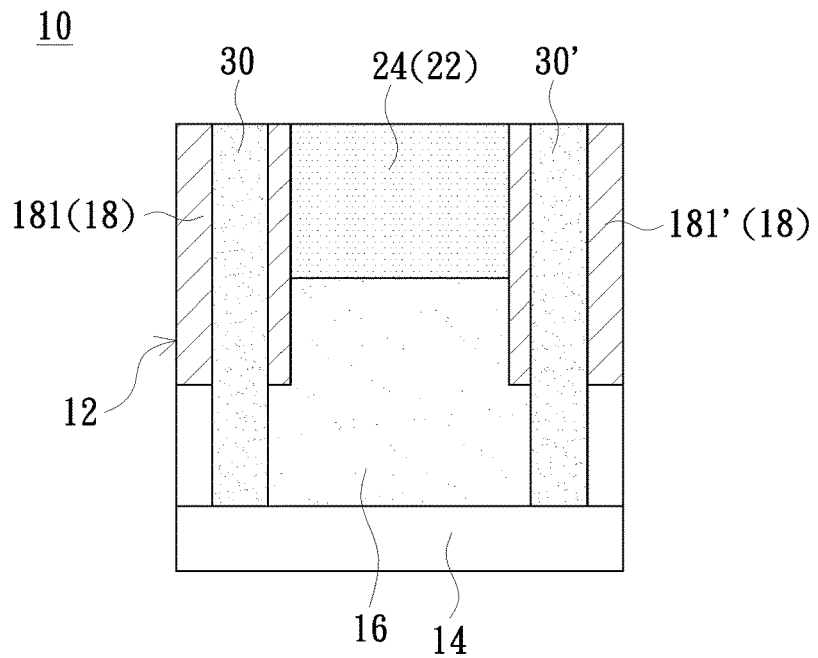
FIG. 3 is a schematic cross-sectional view of the NMOS structure, taken along the line B-B in FIG. 1.
Figure 4:
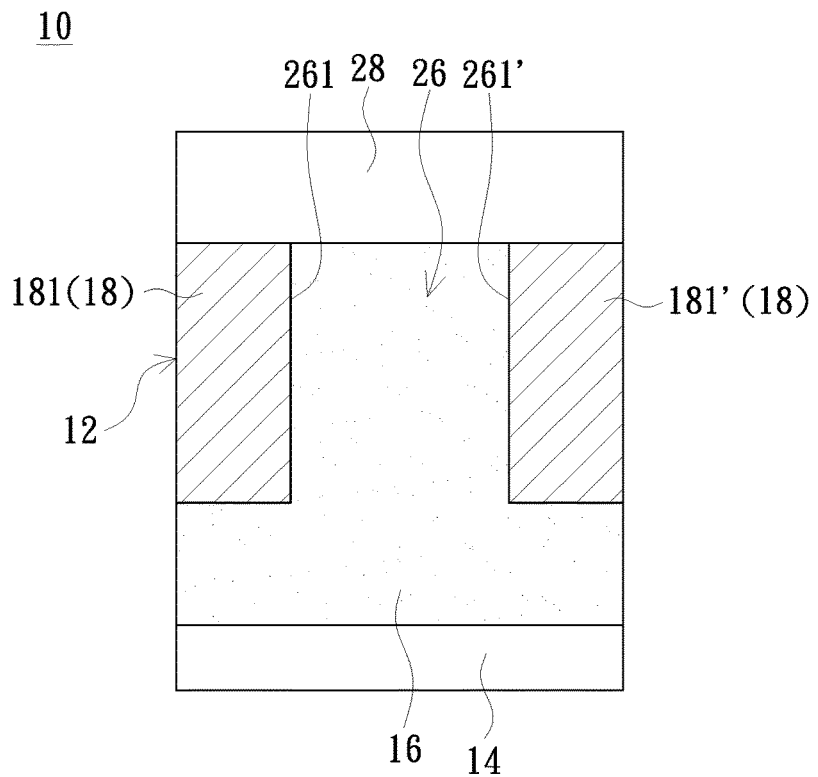
FIG. 4 is a schematic cross-sectional view of the NMOS structure, taken along the line C-C in FIG. 1.

The embodiment of the present invention provides an NMOS structure, which is an image signal processing unit applicable to an image sensor. Specifically, the NMOS structure is a low-noise amplifier applicable to an image signal processing unit. FIG. 1 is a schematic top view of an NMOS structure according to an embodiment of the present invention. FIG. 2 is a schematic cross-sectional view of the NMOS structure, taken along the line A-A in FIG. 1. FIG. 3 is a schematic cross-sectional view of the NMOS structure, taken along the line B-B in FIG. 1. FIG. 4 is a schematic cross-sectional view of the NMOS structure, taken along the line C-C in FIG. 1. As shown in FIGS. 1 to 4, the NMOS structure 10 includes a semiconductor substrate 12. The semiconductor substrate 12 has a deep N-type well 14, a P-type well 16 and a dielectric structure 18. The dielectric structure 18 is formed in the semiconductor substrate 12 to define an active region 20. The dielectric structure 18 is, for example, a shallow trench isolation structure, a field oxide structure, or a combination thereof. In one embodiment as shown in FIG. 1, the dielectric structure 18 has a frame shape, and includes two spaced and opposite first isolation portions 181, 181' and two spaced and opposite second isolation portions 182, 182'.

Following the above description, a source doped region 22, a drain doped region 24 and a channel region 26 (shown in FIGS. 2 and 4) are formed in the active region 20. The source doped region 22 and the drain doped region 24 are separated by the channel region 26. In one embodiment, the channel region 26 includes two opposite first sides 261, 261' (shown in FIG. 4) and two opposite second sides 262, 262' (shown in FIG. 2). The first sides 261, 261' extend to the dielectric structure 18. In one embodiment as shown in FIG. 4, the first sides 261, 261' respectively extend to the first isolation portions 181, 181' of the dielectric structure 18. As shown in FIG. 2, the source doped region 22 and the drain doped region 24 are respectively formed between the second sides 262, 262' and the dielectric structure 18.

As shown in FIGS. 1, 2 and 4, a gate structure 28 is disposed on the semiconductor substrate 12 and corresponding to the channel region 26. In addition, as shown in FIGS. 1 and 4, the gate structure 28 covers part of the dielectric structure 18 beside the first sides 261, 261' of the channel region 26. Specifically, the gate structure 28 is disposed in addition to corresponding to the channel region 26 and extends to cover part of the isolation portions 181, 181' beside the first sides 261, 261'.

As shown in FIGS. 1, 2 and 3, isolation P-type wells 30, 30' are formed in the part of the dielectric structure 18 not covered by the gate structure 28. Specifically, the isolation P-type wells 30, 30' are formed in the other part of the first isolation portions 181, 181' and the second isolation portions 182, 182' not covered by the gate structure 28. In one embodiment as shown in FIG. 1, the isolation P-type well 30 surrounds the periphery of the source doped region 22 and ends at the gate structure 28 (i.e., ends at the second side 262 of the channel region 26), and the isolation P-type well 30' surrounds the periphery of the drain doped region 24 and ends at the gate structure 28 (i.e., ends at the second side 262' of the channel region 26). In one embodiment, the doping concentration of the isolation P-type well 30/30' is higher than the doping concentration of the P-type well 16.

As shown in FIG. 1, the isolation P-type well 30/30' and the periphery of the source doped region 22/drain doped region 24 are separated by a part of the dielectric structure 18. In addition, as shown in FIGS. 2 and 3, the depth of the isolation P-type well 30/30' is greater than the depth of the dielectric structure 18.

Figure 5A:
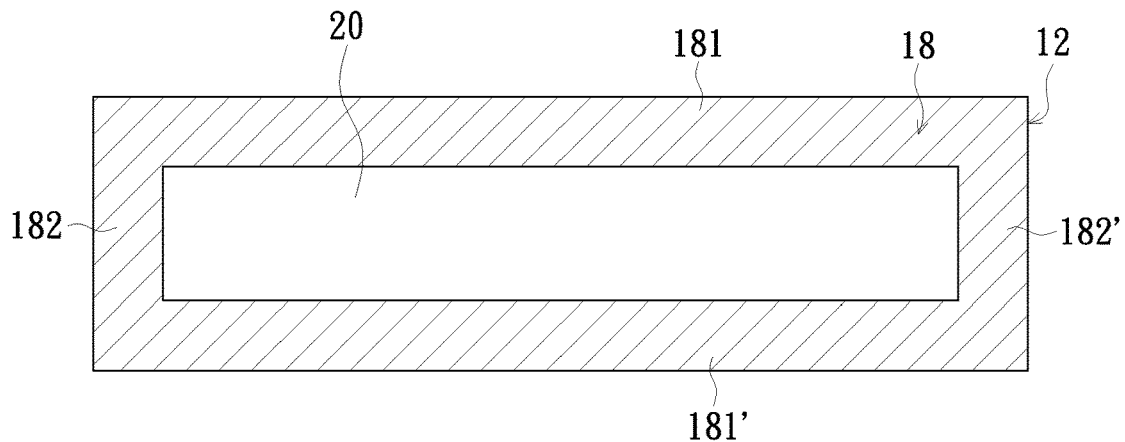
FIGS. 5A to 5E are schematic top views for illustrating various stages of a manufacturing method of an NMOS structure according to an embodiment of the present invention.

FIGS. 5A to 5E are schematic top views for illustrating various stages of a manufacturing method of an NMOS structure according to an embodiment of the present invention. As shown in FIG. 5A, a semiconductor substrate 12 is first provided. The semiconductor substrate 12 is, for example, a P-type silicon substrate, and a deep N-type well 14 (shown in FIGS. 2, 3 and 4) is formed in the P-type silicon substrate. A dielectric structure 18 is formed in the semiconductor substrate 12 to define an active region 20.

The dielectric structure 18 is, for example, a shallow trench isolation structure, a field oxide structure, or a combination thereof. In one embodiment as shown in FIG. 1, the dielectric structure 18 has a frame shape, and includes two spaced and opposite first isolation portions 181, 181' and two spaced and opposite second isolation portions 182, 182'.

Figure 5B:
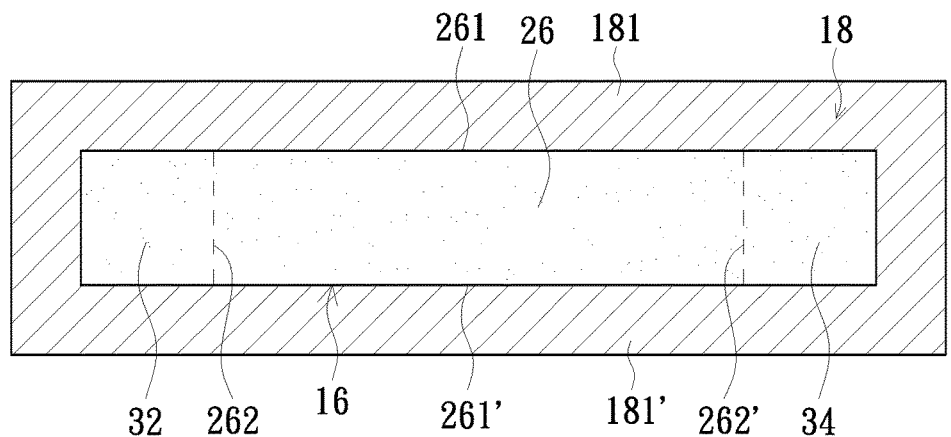

Then, as shown in FIG. 5B, a first mask (not shown) is used to define a source pattern region 32, a drain pattern region 34 and a channel region 26 in the active region 20. The channel region 26 is located between the source pattern region 32 and the drain pattern regions 34. The channel region 26 includes two opposite first sides 261, 261' and two opposite second sides 262, 262'. The first sides 261, 261' extend to the dielectric structure 18. In one embodiment, the first sides 261, 261' respectively extend to the first isolation portions 181, 181' of the dielectric structure 18. In addition, a first doping process is performed to form a P-type well 16 in the active region 20 (shown in FIG. 5A).

Figure 6:
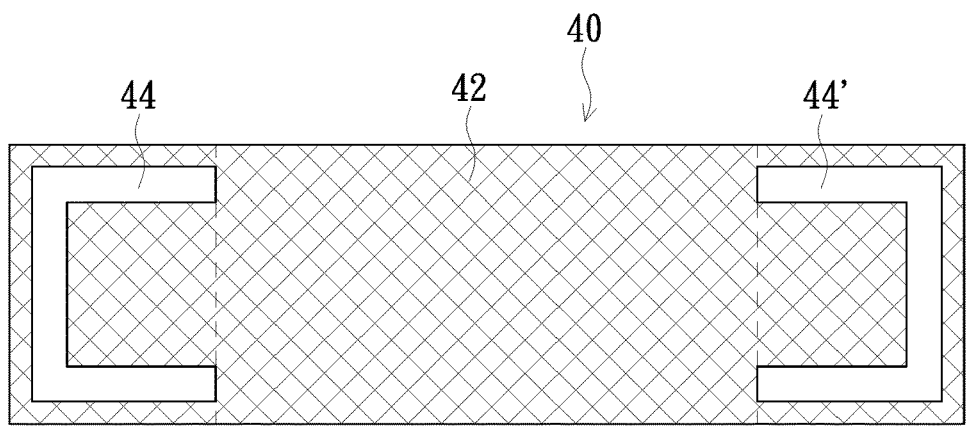
FIG. 6 is a schematic view of a structure of a second mask according to an embodiment of the present invention.

Then, a second doping process is performed through a second mask. Please also refer to FIG. 6. The second mask 40 is defined in advance to have at least a gate shielding pattern 42 and two isolation pattern openings 44, 44'. The isolation pattern openings 44, 44' are separated by the gate shielding pattern 42. The gate shielding pattern 42 is defined to cover the channel region 26 and part of the dielectric structure 18 beside the first sides 261, 261' of the channel region 26. That is, the gate shielding pattern 42 is defined to cover the channel region 26 and part of the first isolation portions 181, 181'. The isolation pattern openings 44, 44' each have a slightly C-shaped slot, and the isolation pattern openings 44, 44' each having a C-shaped slot are arranged in a symmetrical manner. In one embodiment, the pattern design of the second mask 40 can be obtained through a Boolean operation.

Figure 5C:
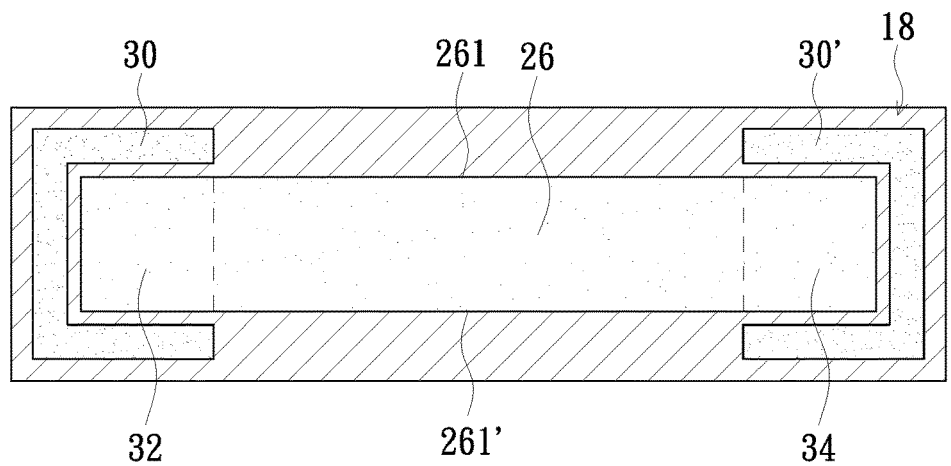

Specifically, as shown in FIG. 5C, two isolation P-type wells 30, 30' are formed in the dielectric structure 18 through the isolation pattern openings 44, 44' of the second mask 40 when the second doping process is performed through the second mask 40. The isolation P-type wells 30, 30' respectively partially surround the source pattern region 32 and the drain pattern region 34 and end at the gate shielding pattern 42 (shown in FIG. 6), that is, the isolation P-type wells 30, 30' are not formed in the part of the dielectric structure 18 beside the first sides 261, 261' of the channel region 26. In one embodiment as shown in FIG. 5C, the isolation P-type wells 30, 30' are not respectively adjacent to the periphery of the source pattern region 32 and the drain pattern region 34 when surrounding the source pattern region 32 and the drain pattern region 34, that is, the isolation P-type well 30/30' and the periphery of the source pattern region 32/drain pattern region 34 are separated by a part of the dielectric structure 18. Referring to FIGS. 2 and 3 together, the depth of the isolation P-type well 30/30' is greater than the depth of the dielectric structure 18.

Figure 5D:
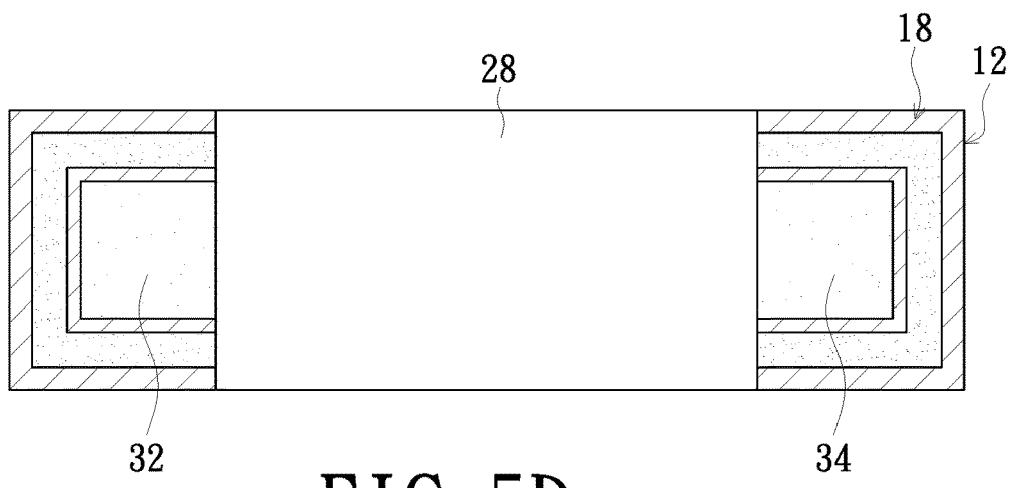
Figure 5E:
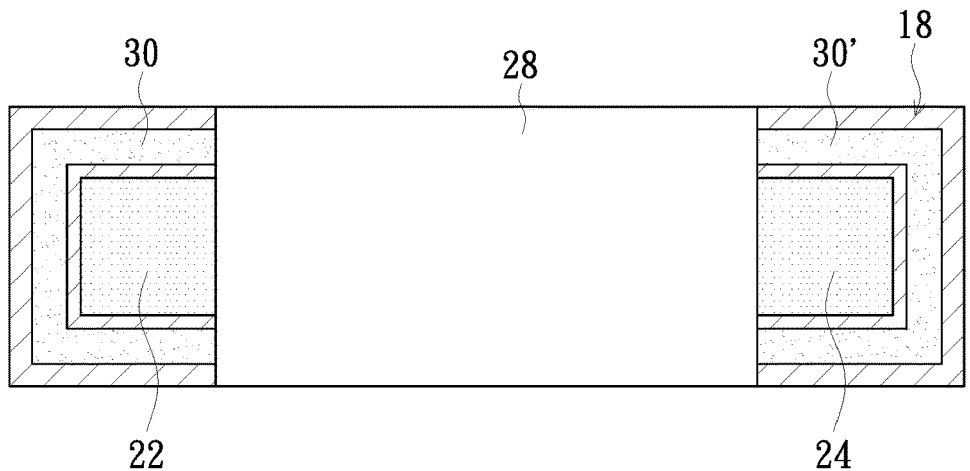

Then, as shown in FIG. 5D, a gate structure 28 is formed on the semiconductor substrate 12. The gate structure 28 covers the channel region 26 and part of the dielectric structure 18 beside the first sides 261, 261' (shown in FIG. 5C) of the channel region 26. Then, as shown in FIG. 5E, a third doping process is respectively performed on the source pattern region 32 and the drain pattern region 34 to form a source doped region 22 and a drain doped region 24 in the source pattern region 32 and the drain pattern region 34. The source doped region 22 and the drain doped region 24 are respectively located on the opposite sides of the gate structure 28 and surrounded by the isolation P-type wells 30, 30' formed in the dielectric structure 18. In one embodiment, an annealing process is performed after the source doped region 22 and the drain doped region 24 are formed.

In the NMOS structure of the embodiment of the present invention, because the isolation P-type well is not formed on the two first sides of the channel region, the concentration of the isolation P-type well does not diffuse into the channel region from the first side, so that the channel region can reduce the carrier scattering by reducing the amount of doping to improve transconductance, which is beneficial to having a better low-noise amplifier performance in the image signal processing unit. In addition, the two isolation P-type wells are respectively disposed to surround the source doped region and the drain doped region. Because the depth of the isolation P-type well is greater than the depth of the dielectric structure, the concentration of the isolation P-type well will diffuse into the P-type well below the source doped region and the drain doped region, so that it has the effect of suppressing leakage current between the source doped region/drain doped region and the deep N-type well. In addition, in the manufacturing method of the NMOS structure of the embodiment of the present invention, the pattern of the second mask can be formed by a simple Boolean operation, and there is no need to use multiple additional masks and multiple patterning processes; thus, the thickness of the pattern photoresist can be reduced and therefore there is an advantage of reducing the cost of the process.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An NMOS structure applicable to an image signal processing unit of an image sensor, wherein the NMOS structure comprises:
   a semiconductor substrate, having a deep N-type well and a P-type well;
   a dielectric structure, formed in the semiconductor substrate to define an active region in the semiconductor substrate, wherein the dielectric structure surrounds the active region;
   a source doped region;
   a drain doped region;
   a channel region, wherein the source doped region, the drain doped region and the channel region are formed in the active region, the source doped region and the drain doped region are separated by the channel region, the channel region comprises two opposite first sides and two opposite second sides, the two first sides extend to the dielectric structure, and the source doped region and the drain doped region are respectively formed between the two second sides and the dielectric structure;
   a gate structure, formed on the semiconductor substrate and corresponding to the channel region, wherein the gate structure covers a part of the dielectric structure beside the two first sides of the channel region; and
   two isolation P-type wells, formed in a part of the dielectric structure not covered by the gate structure, wherein one of the two isolation P-type wells surrounds a periphery of the source doped region and ends at one of the two second sides of the channel region, and the other of the two isolation P-type wells surrounds a periphery of the drain doped region and ends at the other of the two second sides of the channel region, wherein the dielectric structure has a frame shape and comprises two spaced and opposite first isolation portions and two spaced and opposite second isolation portions, the two first isolation portions define the two first sides of the channel region, and the gate structure further covers a part of the two first isolation portions.

2. The NMOS structure according to claim 1, wherein the NMOS structure is applicable to a low-noise amplifier of the image signal processing unit.

3. The NMOS structure according to claim 1, wherein the dielectric structure is a shallow trench isolation structure, a field oxide structure, or a combination thereof.

4. The NMOS structure according to claim 1, wherein a depth of the two isolation P-type wells is greater than a depth of the dielectric structure.

5. The NMOS structure according to claim 1, wherein the two isolation P-type wells are formed in a part of the two first isolation portions not covered by the gate structure and the two second isolation portions.

6. The NMOS structure according to claim 1, wherein the two isolation P-type wells and the periphery of the source doped region and the periphery of the drain doped region are respectively separated by a part of the dielectric structure.

* * * * *